United States Patent
Shim et al.

(10) Patent No.: US 7,781,248 B2
(45) Date of Patent: Aug. 24, 2010

(54) METHOD OF MANUFACTURING NITRIDE SEMICONDUCTOR LIGHT EMITTING DEVICE AND NITRIDE SEMICONDUCTOR LIGHT EMITTING DEVICE MANUFACTURED USING THE METHOD

(75) Inventors: Hyun Wook Shim, Gyunggi-do (KR); Yong Chun Kim, Gyunggi-do (KR); Joong Seo Kang, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/249,049

(22) Filed: Oct. 10, 2008

(65) Prior Publication Data
US 2009/0173965 A1 Jul. 9, 2009

(30) Foreign Application Priority Data
Jan. 7, 2008 (KR) .................... 10-2008-0001927

(51) Int. Cl.
*H01L 21/18* (2006.01)
(52) U.S. Cl. .................... 438/47; 438/46; 257/E21.366; 257/E21.367
(58) Field of Classification Search .................... 257/94, 257/95, 96, 97, E21.366, 367; 438/46, 47
See application file for complete search history.

(56) References Cited

U.S. PATENT DOCUMENTS

2005/0179025 A1* 8/2005 Okuyama et al. ............. 257/13
2006/0060833 A1* 3/2006 Bruckner et al. ............. 257/13

FOREIGN PATENT DOCUMENTS

KR 10-2007-0076829 A 7/2007
KR 10-0755610 B1 8/2007

* cited by examiner

*Primary Examiner*—Kiesha R Bryant
*Assistant Examiner*—Minchul Yang
(74) *Attorney, Agent, or Firm*—McDermott Will & Emery LLP

(57) ABSTRACT

There are provided a method of manufacturing a nitride semiconductor light emitting device and a nitride semiconductor light emitting device manufactured using the same. A method of manufacturing a nitride semiconductor light emitting device according to an aspect of the invention includes: forming a mask layer on a substrate; removing a portion of the mask layer to form openings provided as regions where light emitting structures are formed; forming a light emitting structure by sequentially growing a first conductivity type nitride semiconductor layer, an active layer, and a second conductivity type nitride semiconductor layer on the substrate through each of the openings of the mask layer; and forming first and second electrodes to be electrically connected to the first and second conductivity type nitride semiconductor layers, respectively.

11 Claims, 4 Drawing Sheets

METHOD OF MANUFACTURING NITRIDE SEMICONDUCTOR LIGHT EMITTING DEVICE AND NITRIDE SEMICONDUCTOR LIGHT EMITTING DEVICE MANUFACTURED USING THE METHOD

CROSS-REFERENCE TO RELATED APPLICATIONS

This application claims the priority of Korean Patent Application No. 2008-0001927 filed on Jan. 7, 2008, in the Korean Intellectual Property Office, the disclosure of which is incorporated herein by reference.

BACKGROUND OF THE INVENTION

1. Field of the Invention

The present invention relates to a method of manufacturing a nitride semiconductor light emitting device and a nitride semiconductor light emitting device manufactured using the method, and more particularly, to a method of manufacturing a nitride semiconductor light emitting device using a mask layer for growth on the basis of light emitting device chips and a nitride semiconductor light emitting device manufactured using the same.

2. Description of the Related Art

A light emitting diode (LED) is a semiconductor light emitting device that emits light of various colors by recombination of electrons and holes in a p-n junction between p-type and n-type semiconductors when a current is applied to the LED. When compared with a filament-based light emitting device, the LED has longer lifetime, low power consumption, excellent initial driving characteristics, high vibration resistance, and high tolerance for repetitive power switching. Thus, there has been an increasing demand for the LEDs. These days, group III nitride semiconductors that can emit light in short-wavelength region, such as a series of blue, have attracted attention.

In general, indium gallium nitride ($In_{1-x}Ga_xN$, $0<x<1$) among group III-V nitride semiconductors can generate light in the visible ray region to the UV region according to the indium (In) content. Further, the indium gallium nitride is widely used as a quantum well of an LED or a laser diode (LD).

FIG. 1 is a cross-sectional view illustrating a general nitride semiconductor light emitting device.

Referring to FIG. 1, a nitride semiconductor light emitting device 10 includes an n-type nitride semiconductor layer 12, an active layer 13, and a p-type nitride semiconductor layer 14, which are sequentially formed on a sapphire substrate 11. Further, n-type and p-type electrodes 15*a* and 15*b* are formed on a region formed by mesa-etching the n-type nitride semiconductor layer 12 and the p-type nitride semiconductor layer 14, respectively.

As such, in the nitride semiconductor light emitting device 10, a hetero substrate such as a sapphire substrate is generally used as a nitride semiconductor single crystal growth substrate.

Here, the nitride semiconductor single crystal has high defect density due to stress caused by lattice mismatching with the hetero substrate, which leads to a reduction in electrical and optical characteristics.

Recently, there has been a need for the use of nitride semiconductor light emitting devices in high-power apparatuses such as lighting apparatuses. Therefore, there has been a need for a method of improving an epitaxial layer forming a light emitting structure in quality and increasing luminous efficiency.

SUMMARY OF THE INVENTION

An aspect of the present invention provides a method of manufacturing nitride semiconductor light emitting device and a nitride semiconductor light emitting device that can obtain improved electrical and optical characteristics by using a mask layer for growth on the basis of light emitting device chips to reduce stress between an epitaxial layer and a substrate.

An aspect of the present invention also provides a method of manufacturing a nitride semiconductor light emitting device, the method including: forming a mask layer on a substrate; removing a portion of the mask layer to form openings provided as regions where light emitting structures are formed; forming a light emitting structure by sequentially growing a first conductivity type nitride semiconductor layer, an active layer, and a second conductivity type nitride semiconductor layer on the substrate through each of the openings of the mask layer; and forming first and second electrodes to be electrically connected to the first and second conductivity type nitride semiconductor layers, respectively.

The mask layer may include a plurality of openings, and one light emitting structure may be formed within each of the plurality of openings.

Neighboring openings of the plurality of openings may be separated from each other by a distance of 5 um or more.

The method may further include cutting the substrate and the mask layer on the basis of the light emitting structures after forming the light emitting structure.

Each of the openings of the mask layer may have a patterned side surface, and each of the light emitting structures may be grown and have a side surface having the same shape as the patterned side surface.

The mask layer may have a thickness of 20 nm or more.

The forming a light emitting structure may be performed so that the light emitting structure has a narrower width toward a direction in which the light emitting structure grows.

The forming a light emitting structure may be performed so that the side surface of the light emitting structure has a slope of 40 to 85 degrees with respect to a horizontal plane.

The mask layer may be formed of a silicon oxide or a silicon nitride.

The mask layer may be formed of a transparent conductive oxide or a metal.

The first and second conductivity type nitride semiconductor layers may be n-type and p-type nitride semiconductor layers, respectively.

According to an aspect of the present invention, there is provided a nitride semiconductor light emitting device manufactured using the above-described method of manufacturing nitride semiconductor light emitting device.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
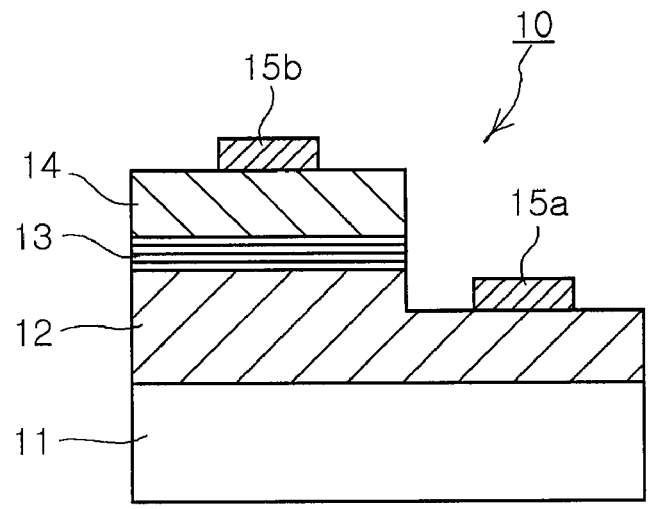
FIG. 1 is a cross-sectional view illustrating a general nitride semiconductor light emitting device.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIGS. 2A to 2E are cross-sectional views illustrating processes of a method of manufacturing a nitride semiconductor light emitting device according to an exemplary embodiment of the invention.

Figure 2A:
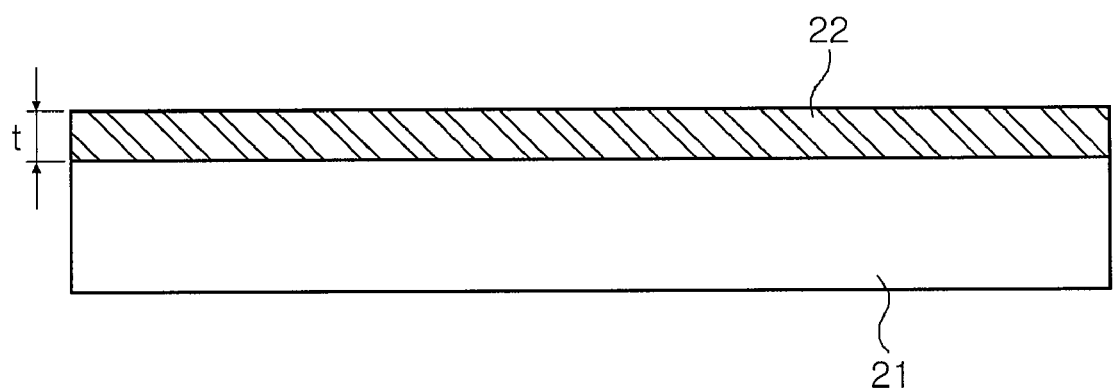
FIGS. 2A to 2E are cross-sectional views illustrating processes of a method of manufacturing a nitride semiconductor light emitting device according to an exemplary embodiment of the present invention.

First, as shown in FIG. 2A, a mask layer 22 is formed on a substrate 21.

The substrate 21 is used as a nitride semiconductor single crystal growth substrate. The present invention is not limited thereto, and a sapphire substrate, a SiC substrate, or a GaN substrate may be used.

The mask layer 22 to be described below is used to divide an area of the substrate 21 into a plurality of portions where light emitting structures are formed. The mask layer 22 may be formed of a silicon oxide ($SiO_x$) or a silicon nitride ($SiN_x$). Further, the mask layer 22 may be formed of a transparent conductive oxide (TCO) in consideration of electrical and optical characteristics of the mask layer 22. Examples thereof may include ITO (Indium Tin Oxide), ZnO, AlZnO, and InZnO. Alternatively, the mask layer 22 may be formed of a metal according to an embodiment.

Since the mask layer 22 is used as a mask separating the devices from each other, the mask layer 22 may preferably have a thickness t of 20 nm or more, and particularly, the thickness t of 100 nm or more, even though the thickness of the mask layer 22 may be changed according to a distance between openings to be described below.

Figure 2B:
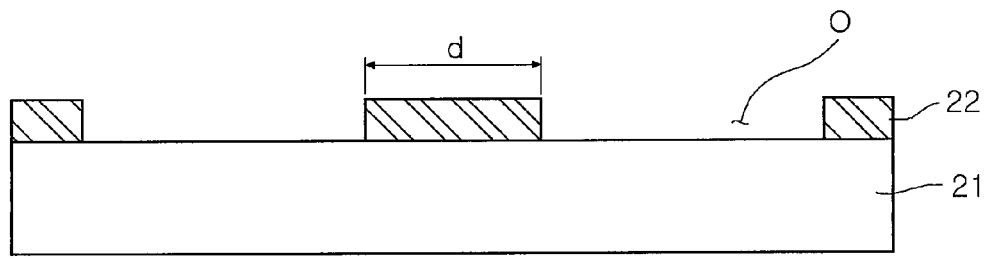

Then, as shown in FIG. 2B, a portion of the mask layer 22 is removed by etching or the like to thereby form openings O through which an upper surface of the substrate 21 is exposed to the outside.

Each of the openings O corresponds to a region in which one light emitting structure including n-type and p-type nitride semiconductor layers and an active layer is formed, that is, a growth region on the basis of a light emitting device chip.

Therefore, light emitting devices adjacent to each other should not be attached to each other due to lateral growth when an epitaxial layer is grown, and a predetermined distance between the neighboring openings O needs to be ensured. Preferably, the neighboring openings O of the plurality of openings O may be separated from each other by a distance d of 5 μm or more. In order for the light emitting structures to grow in the unit of chips while they are not attached to each other by controlling a growth method and growth speed, a distance of approximately 2 μm or more may be sufficient. However, in consideration of processing efficiency and productivity, the openings O may be separated from each other by the distance of 5 μm or more.

The process of partially removing the mask layer 22 may be performed by using chemical and mechanical methods that form openings.

Figure 2C:
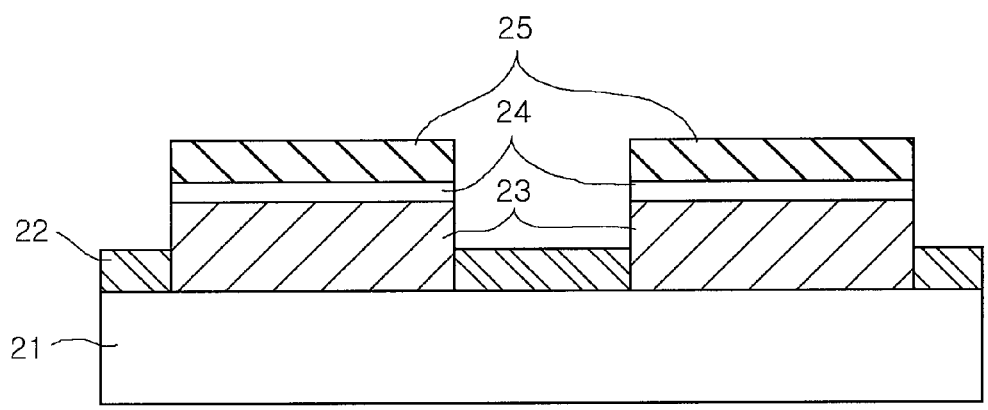

Then, as shown in FIG. 2C, light emitting structures are formed within the openings O on the substrate 21. In this specification, the "light emitting structure" can be understood as a stacked structure of semiconductor layers including the n-type and p-type nitride semiconductor layers 23 and 25 and an active layer 24.

Further, in this embodiment, the "nitride semiconductor" refers to a binary, ternary, or quaternary compound semiconductor, which is expressed by the following equation: $Al_xIn_yGa_{(1-x-y)}N$ (here, $0 \leq x \leq 1$, $0 \leq y \leq 1$, $0 \leq x+y \leq 1$).

That is, the n-type and p-type nitride semiconductor layers 23 and 25 may be formed of semiconductor materials doped with an n-type impurity and a p-type impurity, which are expressed by the following equation: $Al_xIn_yGa_{(1-x-y)}N$ (here, $0 \leq x \leq 1$, $0 \leq y \leq 1$, and $0 \leq x+y \leq 1$). Examples of the semiconductor materials may include GaN, AlGaN, and InGaN. Examples of the n-type impurity may include Si, Ge, Se, Te, or C, and examples of the p-type impurity may include Mg, Zn, or Be.

The active layer 24 is formed of a nitride semiconductor layer having a single or multiple quantum well structure, and emits light having predetermined energy by recombination of electrons and holes.

The n-type and p-type nitride semiconductor layers 23 and 25 and the active layer 24 may be grown by using a process of growing a semiconductor single crystal, in particular, by using metal organic chemical vapor deposition (MOCVD), molecular beam epitaxy (MBE), or hydride vapor phase epitaxy (HVPE), which is known as a nitride single crystal growth process.

Figure 2D:
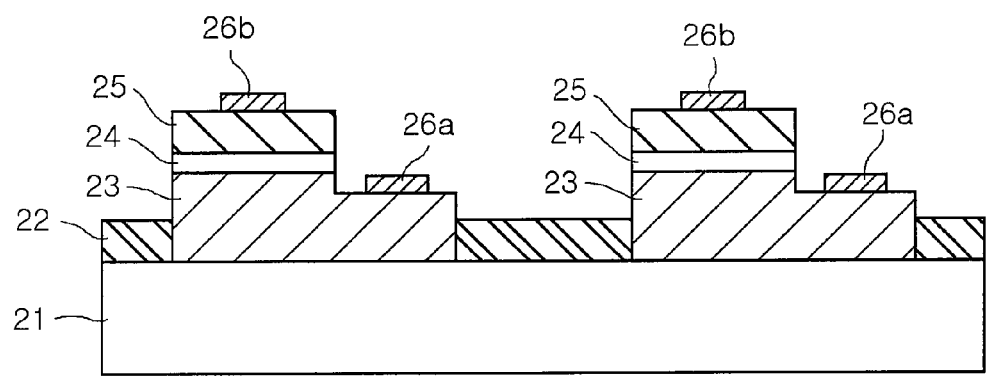

According to this embodiment, as shown in FIG. 2D, the light emitting structures are formed within the openings formed in the mask layer 22 on the substrate 21, and are grown while they are separated from each other.

When a plurality of light emitting structures are formed on one substrate, if an epitaxial layer is grown over the entire area of the substrate and then the light emitting structures are cut off from each other, great stress may be applied due to a large contact area between the epitaxial layer and the hetero substrate. Further, when the plurality of light emitting structures are connected to each other by the single epitaxial layer, an error may often occur during a scribing process.

However, in this embodiment, the growth area is divided on the basis of the light emitting structures, the stress between the substrate 21 and the nitride semiconductor layers 23, 24, and 25 forming the light emitting structures can be reduced. Further, it is possible to easily separate the light emitting structures from each other on the basis of light emitting devices along the regions between the light emitting structures.

In the above-described processes of the embodiment of the invention, two light emitting devices are formed. However, a larger number of light emitting structures may be generally formed. Alternatively, one light emitting structure may be only formed.

Then, as shown in FIG. 2D, n-type and p-type electrodes 26a and 26b are formed on an upper surface of the n-type nitride semiconductor layer 23 and an upper surface of the p-type nitride semiconductor layer 25, respectively. According to this embodiment, a process of mesa-etching a portion of the light emitting structure may be further included to form the n-type electrode 26a. However, the mesa-etching process may not be required according to an embodiment, for example, in a vertical light emitting device.

Herein, the n-type and p-type electrodes 26a and 26b are formed to make an electrical connection of the device. Each of the n-type and p-type electrodes 26a and 26b is formed of Au or an Au alloy. The n-type electrode 26a and the p-type electrode 26b may be formed by evaporation or sputtering, which is a general metal layer growing method.

Then, the light emitting devices are cut off from each other. As described above, according to this embodiment, since the light emitting structures are already separated from each other during the process of growing the epitaxial layer, they can be easily cut off from each other in the unit of devices by cutting regions of the substrate 21 and the mask layer 22, where the light emitting structures are not formed.

Figure 2E:
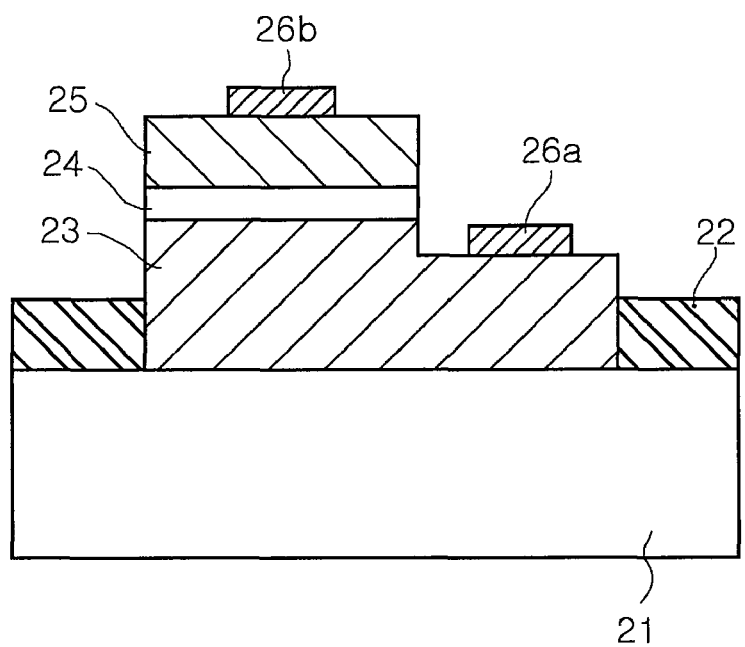

FIG. 2E is a view illustrating one nitride semiconductor light emitting device formed by cutting the light emitting structures from each other in the unit of devices.

Figure 3:
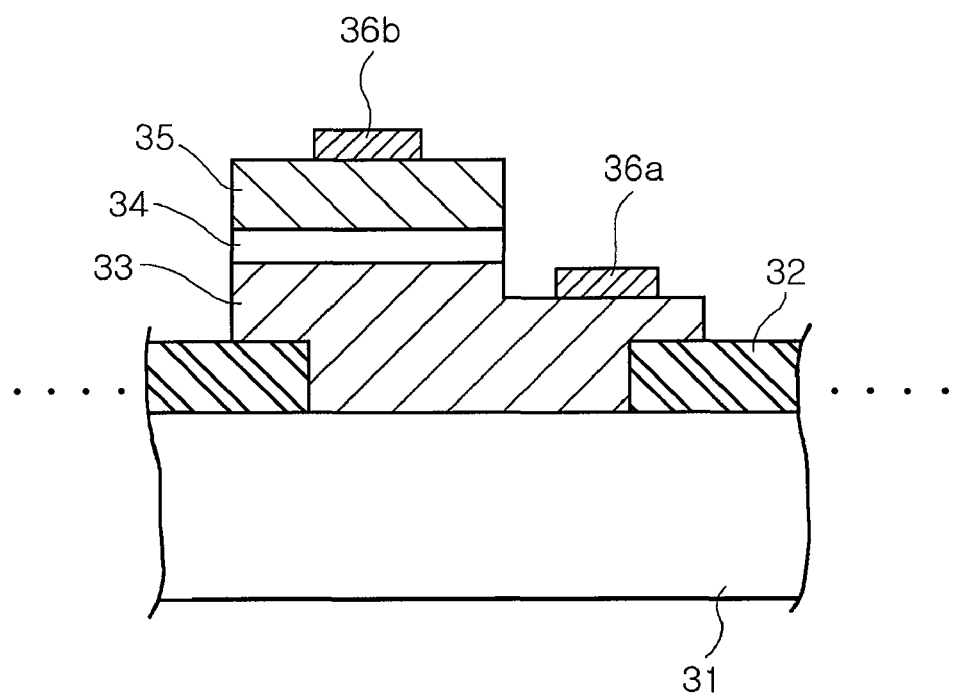
FIG. 3 is a partial cross-sectional view illustrating a process of a method of manufacturing a nitride semiconductor light emitting device according to another exemplary embodiment of the present invention that is a modification of the embodiment of FIG. 2.

FIG. 3 is a partial cross-sectional view illustrating a process of a method of manufacturing a nitride semiconductor light emitting device according to another embodiment of the invention that is a modification of the embodiment of FIG. 2.

A process, shown in FIG. 3, may correspond to FIG. 2D according to the above-described embodiment. In FIG. 3, one light emitting structure is only illustrated.

Like FIG. 2, referring to FIG. 3, a mask layer 32 having an opening is formed on a substrate 31, and an n-type nitride semiconductor layer 33, an active layer 34, and a p-type nitride semiconductor layer 35 are sequentially grown on the substrate 31 through the opening. Further, the light emitting device according to this embodiment is a horizontal light emitting device, and n-type and p-type electrodes 36a and 36b are formed on the n-type and p-type nitride semiconductor layers 33 and 35 and electrically connected thereto.

According to this embodiment, the n-type nitride semiconductor layer 33 that is grown within the opening is also formed on a portion of the upper surface of the mask layer 32 due to lateral growth to some extent. The critical angle of light reflection can be adjusted by controlling the thickness of the mask layer 32 and the length and shape of the n-type nitride semiconductor layer 33 formed on the mask layer 32. Therefore, in the light emitting device according to this embodiment, the critical angle of light reflection can be controlled and thus, light extraction efficiency can be improved.

Besides the above-described difference, other components represented by the same terms can be considered as the same components in FIG. 2, and thus a description thereof will be omitted.

Figure 4:
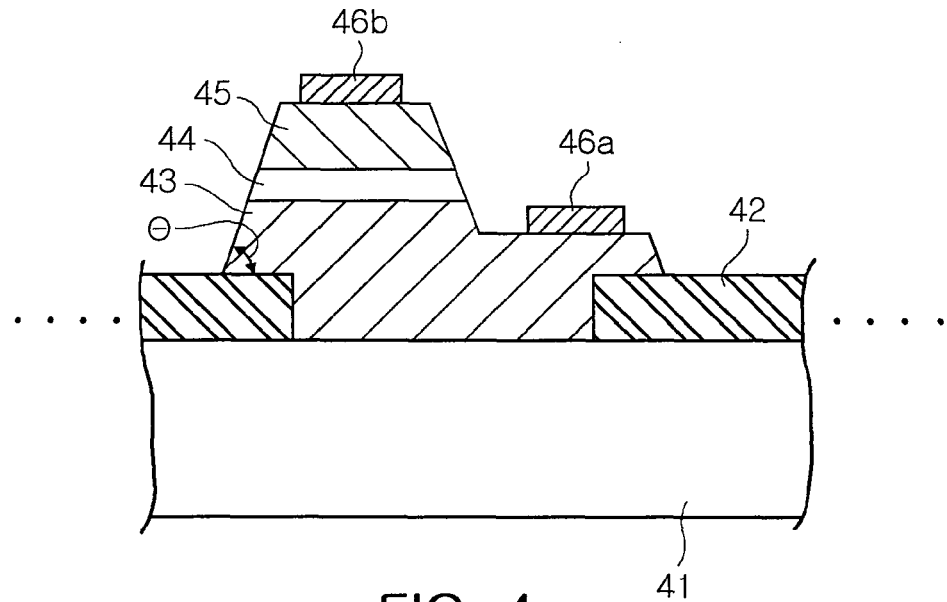
FIG. 4 is a partial cross-sectional view illustrating a process of a method of manufacturing a nitride semiconductor light emitting device according to still another exemplary embodiment of the present invention.

FIG. 4 is a partial cross-sectional view illustrating a method of manufacturing a nitride semiconductor light emitting device according to still another embodiment of the present invention.

In a process described in FIG. 4, the light emitting structure according to the embodiment of FIG. 3 has an inclined side surface.

Referring to FIG. 4, like FIG. 3, a mask layer 42 having an opening is formed on a substrate 41, and an n-type nitride semiconductor layer 43, an active layer 44, and a p-type nitride semiconductor layer 45 are sequentially formed on the substrate 41 through the opening. Further, the light emitting device according to this embodiment is a horizontal light emitting device, and n-type and p-type electrodes 46a and 46b are formed on the n-type and p-type nitride semiconductor layers 43 and 45, respectively, and are electrically connected thereto.

In this embodiment, the side surface of the n-type nitride semiconductor layer 43, the active layer 44, and the p-type nitride semiconductor layer 45, that is, the side surface of the light emitting structure is grown to be inclined. Therefore, as compared with the light emitting structure of FIG. 3, external light extraction efficiency can be improved because of a reduction in total internal reflection. Preferably, the light emitting structure may be grown so that the side surface of the light emitting structure has a slope ($\theta$) of 40 to 85° with respect to the horizontal plane, that is, a growth surface of the substrate.

As for the method of forming a light emitting structure having a side surface with a predetermined slope, a known method in the corresponding field may be used, such as the control of the horizontal and vertical growth speed of the nitride semiconductor single crystal.

Figure 5:
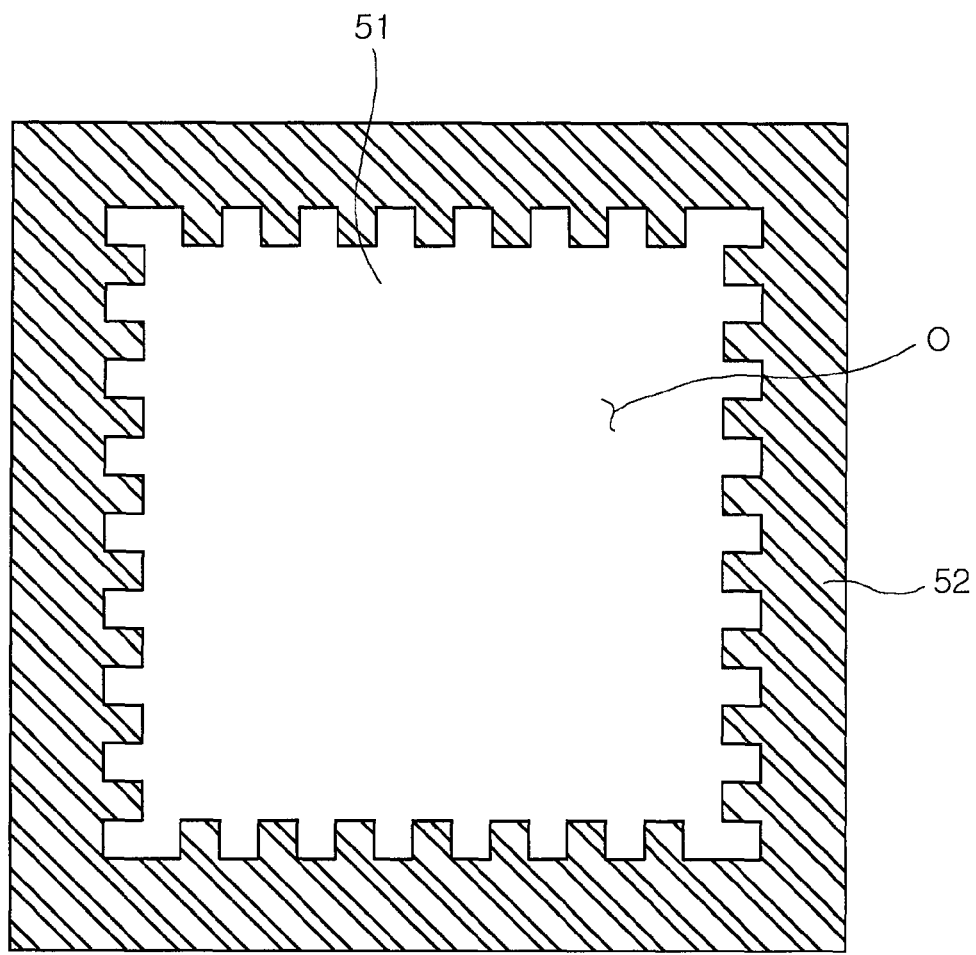
FIG. 5 is a plane view illustrating a substrate and a mask layer to illustrate a method of manufacturing a nitride semiconductor light emitting device according to yet another exemplary embodiment of the present invention.

FIG. 5 is a plane view illustrating a substrate and a mask layer to illustrate a method of manufacturing a nitride semiconductor light emitting device according to yet another embodiment of the present invention.

According to this embodiment, a substrate 51 is exposed to the outside through an opening O formed by partially etching a mask layer 52, and the side of the opening O has a patterned shape.

Therefore, the side of a light emitting structure grown through the opening O also has the same patterned shape as that of the opening O. The patterned shape results in an increase in external light extraction efficiency.

In FIG. 5, only one opening O is formed in the mask layer 52. However, as described above, the number of openings O may vary according to the number of light emitting structures required.

As set forth above, according to the exemplary embodiments of the invention, it is possible to a method of manufacturing a nitride semiconductor light emitting device and a nitride semiconductor light emitting device manufactured using the method that can obtain improved electrical and optical characteristics by using a mask layer for growth on the basis of light emitting device chips to reduce stress between an epitaxial layer and a substrate.

Further, as described above, the reduction in stress between the epitaxial layer and the substrate results in a reduction in bowing of light emitting structures during growth. Therefore, it is possible to reduce errors in subsequent processes including scribing.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a nitride semiconductor light emitting device, the method comprising:
   forming a mask layer on a substrate;
   removing a portion of the mask layer to form openings provided as regions where light emitting structures are formed;
   forming a light emitting structure by sequentially growing a first conductivity type nitride semiconductor layer, an active layer, and a second conductivity type nitride semiconductor layer on the substrate through each of the openings of the mask layer; and
   forming first and second electrodes to be electrically connected to the first and second conductivity type nitride semiconductor layers, respectively,
   wherein each of the openings of the mask layer has a roughened side surface, and each of the light emitting structures is grown and has a side surface having the same shape as the roughened surface.

2. The method of claim 1, wherein the mask layer comprises a plurality of openings, and one light emitting structure is formed within each of the plurality of openings.

3. The method of claim 2, wherein neighboring openings of the plurality of openings are separated from each other by a distance of 5 um or more.

4. The method of claim 2, further comprising:
   cutting the substrate and the mask layer on the basis of the light emitting structures after forming the light emitting structure.

5. The method of claim 1, wherein the mask layer has a thickness of 20 nm or more.

6. The method of claim 1, wherein the forming a light emitting structure is performed so that the light emitting structure has a narrower width toward a direction in which the light emitting structure grows.

7. The method of claim 6, wherein the forming a light emitting structure is performed so that the side surface of the light emitting structure has a slope of 40 to 85 degrees with respect to a horizontal plane.

8. The method of claim 1, wherein the mask layer is formed of a silicon oxide or a silicon nitride.

9. The method of claim 1, wherein the mask layer is formed of a transparent conductive oxide or a metal.

10. The method of claim 1, wherein the first and second conductivity type nitride semiconductor layers are n-type and p-type nitride semiconductor layers, respectively.

11. A nitride semiconductor light emitting device manufactured using the method of claim 1.

* * * * *